(12) United States Patent
Grasshoff et al.

(10) Patent No.: US 7,005,305 B2
(45) Date of Patent: Feb. 28, 2006

(54) SIGNAL LAYER FOR GENERATING CHARACTERISTIC OPTICAL PLASMA EMISSIONS

(75) Inventors: Gunter Grasshoff, Radebeul (DE); Christoph Schwan, Gebhardshain (DE); Matthias Schaller, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 217 days.

(21) Appl. No.: 10/447,877

(22) Filed: May 29, 2003

(65) Prior Publication Data

US 2004/0106284 A1 Jun. 3, 2004

(30) Foreign Application Priority Data

Nov. 29, 2002 (DE) ................................ 102 55 850

(51) Int. Cl.
*H01L 21/00* (2006.01)
(52) U.S. Cl. ............................. 438/9; 438/16; 438/706; 438/710; 438/719; 438/720; 438/723; 438/724; 216/59; 216/60
(58) Field of Classification Search ................ 216/59, 216/60; 438/9, 16, 706, 710, 719, 720, 723
See application file for complete search history.

(56) References Cited

U.S. PATENT DOCUMENTS 5,846,373 A * 12/1998 Pirkle et al. ........... 156/345.25
5,877,407 A 3/1999 Cadet et al. ................ 73/24.01
6,060,328 A * 5/2000 En et al. ......................... 438/9
6,136,712 A * 10/2000 Klippert, II et al. ........ 438/692
6,333,271 B1 * 12/2001 Chiu et al. ................... 438/706
6,593,232 B1 * 7/2003 Huang et al. ............... 438/637
2003/0012925 A1 * 1/2003 Gorrell ....................... 428/137

FOREIGN PATENT DOCUMENTS

DE       37 86 851 T2    2/1988
JP       06244150 A      9/1994

OTHER PUBLICATIONS

Wolf et al., Silicon Processing for the VLSI Era, 1986, Lattice Press, vol. 1, p. 191.*

* cited by examiner

*Primary Examiner*—Nadine G. Norton
*Assistant Examiner*—Eric B. Chen
(74) *Attorney, Agent, or Firm*—Williams, Morgan & Amerson, P.C.

(57) ABSTRACT

A technique is provided that may be used to improve optical endpoint detection in a plasma etch process. A semiconductor structure is manufactured that includes at least one electrical device. The technique is adapted for forming a signal layer on or in a wafer, wherein the signal layer comprises a chemical element that causes a characteristic optical emission when coming into contact with an etch plasma. The chemical element does not have a primary influence on the electrical properties of the electrical device. The signal layer is for use in a plasma etch process to detect a plasma etch endpoint if the characteristic optical emission is detected. The signal layer may be patterned and may be incorporated into a stop layer.

25 Claims, 4 Drawing Sheets

SIGNAL LAYER FOR GENERATING CHARACTERISTIC OPTICAL PLASMA EMISSIONS

BACKGROUND OF THE INVENTION

1. Field of the Invention

The present invention generally relates to plasma etching of semiconductor structures, and, more particularly, to an optical endpoint detection while plasma etching.

2. Description of the Related Art

Manufacturers in the electronic sectors, in particular semiconductor manufacturers, use plasma technology for a variety of surface modification and etching applications. Plasma is a mixture of electrically charged and neutral particles, including electrons, atoms, ions and free radicals, and occurs only under certain environmental circumstances. It will react with a wide variety of substances, and can be used to clean, etch or coat almost any surface without great safety efforts and liquid waste associated with other processes.

During a plasma etch process, when building up an integrated circuit chip, one has to accurately determine the etch depth. An integrated circuit chip comprises inseparably connected circuit elements fabricated onto, or within, a suitable substrate material. Most common substrates are silicon or gallium arsenide in the form of wafers. A typical integrated circuit chip may comprise twenty or more layers of semiconducting materials, one on top of the other, forming a multi-layer structure. The layers may be patterned such that the entire structure forms the various circuit elements, such as resistors, capacitors, via holes, etc. The precision of the dimensions of those circuit elements may also depend on the controllability of a plasma etch process, and in particular on the precision of an etch depth monitoring.

Etch depth monitoring, in its simplest form, may comprise calibrating a process and then simply timing the etch run. However, run-to-run etch rate variations of up to ten percent may be expected using this method. More accurate etch depth may be obtained by etching for three-quarters of the predicted etch time, measuring the etch depth, and then predicting the time required to finish the etch. This has the major drawback of being time-consuming, and therefore expensive.

Common etch depth monitoring techniques are based on the fact that there is, in most cases, a change in the spectral composition of the light emitted by the plasma when the plasma comes into contact with an underlying surface during the etch process. Basically, the optical plasma emission reacts on the change in the chemical composition and/or electrical characteristic of the discharge due to the fact of contacting an interface layer.

For an increasing number of process applications, this approach does not provide a reliable detection performance. Moreover, several etch processes may be necessary to pattern layers where the ratio of etch-exposed areas to total substrate areas is very low. Further, an endpoint signal may be disturbed by the etch of large areas with other etch characteristics. Other difficulties may arise when etching stacks of material which have no or low differences in their chemical composition, so that the event of passing this interface is very hard to detect.

A simple multi-layer structure is illustrated in FIG. 1. As can be seen, the multi-layer structure comprises several layers of dielectric material 110. Metal layers are formed at the interfaces 100 between the dielectric layers 110. The metal layers are vertically connected by via holes 120, 130, 160. The via holes may be arranged for vertically connecting an electronic device 140 that is embedded in the multi-layer structure, for instance to connect the electronic device 140 with the top metal layer.

As can further be seen, the via hole 160 is enlarged to provide a more detailed view. The enlarged depiction 170 illustrates that the via hole 160 does not exactly end at the metal layer 190 so that the via hole 160 is shifted or offset into its lower dielectric layer. This shifting 180 of the via hole 160 may be caused by a conventional, inaccurate etch endpoint process, due to the above-described problems occurring with known etch depth monitoring techniques.

It is to be noted that an inaccurate etch endpoint process does not only affect dimensions of the illustrated via hole 160. Furthermore, all electronic devices embedded in any structure can be affected.

An inaccurate etch endpoint process is disadvantageous because for inaccurately etched structures it is difficult to predict parameters of the electronic devices and therefore it is difficult to predict the circuitry behavior. Further, for instance, inaccurately etched devices may require a re-manufacture or a redesign of the integrated circuit chip or may even require additional circuits to be provided to calibrate critical parameters.

The present invention is directed to various methods and systems that may solve, or at least reduce, some or all of the aforementioned problems.

SUMMARY OF THE INVENTION

A technique is provided that may be used to improve the optical endpoint detectability in a plasma etch process. In one embodiment, there is provided a method of manufacturing a semiconductor structure including at least one electrical device. The method comprises forming a signal layer on or in a wafer, wherein the signal layer comprises a chemical element that causes a characteristic optical emission when coming into contact with an etch plasma. The chemical element does not have a primary influence on the electrical properties of the electrical device. The method further comprises applying an etch plasma to the surface of the wafer and performing a plasma etch endpoint process when the characteristic optimal emission is detected.

In a further embodiment, there is provided an integrated circuit chip that has a semiconductor structure that includes at least one electrical device. The semiconductor structure is manufactured by forming a signal layer on or in a wafer, applying an etch plasma to the surface of the wafer, and performing a plasma etch endpoint process when a characteristic optical emission is detected. The signal layer comprises a chemical element that causes the characteristic optical emission when coming into contact with the etch plasma. The chemical element does not have a primary influence on the electrical properties of the electrical device.

In another embodiment, there is provided a method of manufacturing a semiconductor structure. The method comprises forming a stop layer that provides an etch plasma resistance effecting a low plasma etch rate. The stop layer comprises a chemical signal element, wherein the chemical signal element causes a characteristic optical emission when coming into contact with an etch plasma. The method further comprises applying an etch plasma to the surface of the wafer, and performing a plasma etch endpoint process when the characteristic optical emission is detected.

In a further embodiment, there is provided an apparatus for manufacturing a semiconductor structure. The apparatus is adapted for forming a stop layer that provides an etch plasma resistance effecting a low plasma etch rate. The stop layer comprises a chemical signal element, wherein the chemical signal element causes a characteristic optical emission when coming into contact with an etch plasma. The stop layer is for use in a plasma etch process to detect a plasma etch endpoint if the characteristic optical emission is detected.

In yet another embodiment, there is provided a method of manufacturing a semiconductor structure. The method comprises forming a signal layer on or in a wafer. The signal layer is a patterned signal layer. The method further comprises applying an etch plasma to the surface of the wafer, and performing a plasma etch endpoint process when a characteristic optical emission is detected, wherein the characteristic optical emission is caused by a chemical element of the patterned signal layer when the chemical element comes into contact with the etch plasma.

In a further embodiment, there is provided an apparatus for manufacturing a semiconductor structure. The apparatus is adapted for forming a patterned signal layer on or in a wafer, applying an etch plasma to the surface of the wafer, and performing a plasma etch endpoint process when a characteristic optical emission is detected. The patterned signal layer comprises a chemical element that causes the characteristic optical emission when coming into contact with the etch plasma. The patterned signal layer is for use in a plasma etch process to detect a plasma etch endpoint if the characteristic optical emission is detected.

In still a further embodiment, there is provided an apparatus for manufacturing a semiconductor structure including at least one electrical device. The apparatus is adapted for forming a signal layer on or in a wafer, wherein the signal layer comprises a chemical element that causes a characteristic optical emission when coming into contact with an etch plasma. The chemical element does not have a primary influence on the electrical properties of the electrical device. The signal layer is for use in a plasma etch process to detect a plasma etch endpoint if the characteristic optical emission is detected.

In an additional embodiment, there is provided a plasma etch apparatus for plasma etching a wafer that includes at least one electrical device in a semiconductor structure manufacturing process. The plasma etch apparatus comprises a plasma generator for generating an etch plasma that is applied to the surface of the wafer, an optical detector for detecting optical plasma emissions, and a control unit for initiating a plasma etch endpoint process. The optical detector is configured to detect a characteristic optical emission that is caused by a chemical element of a signal layer when the chemical element comes into contact with the etch plasma. The chemical element has no primary influence on the electrical properties of the electrical device. The control unit is configured to initiate the plasma etch endpoint process when the characteristic optical emission is detected.

BRIEF DESCRIPTION OF THE DRAWINGS

The invention may be understood by reference to the following description taken in conjunction with the accompanying drawings, in which like reference numerals identify like elements, and in which.

Figure 1:
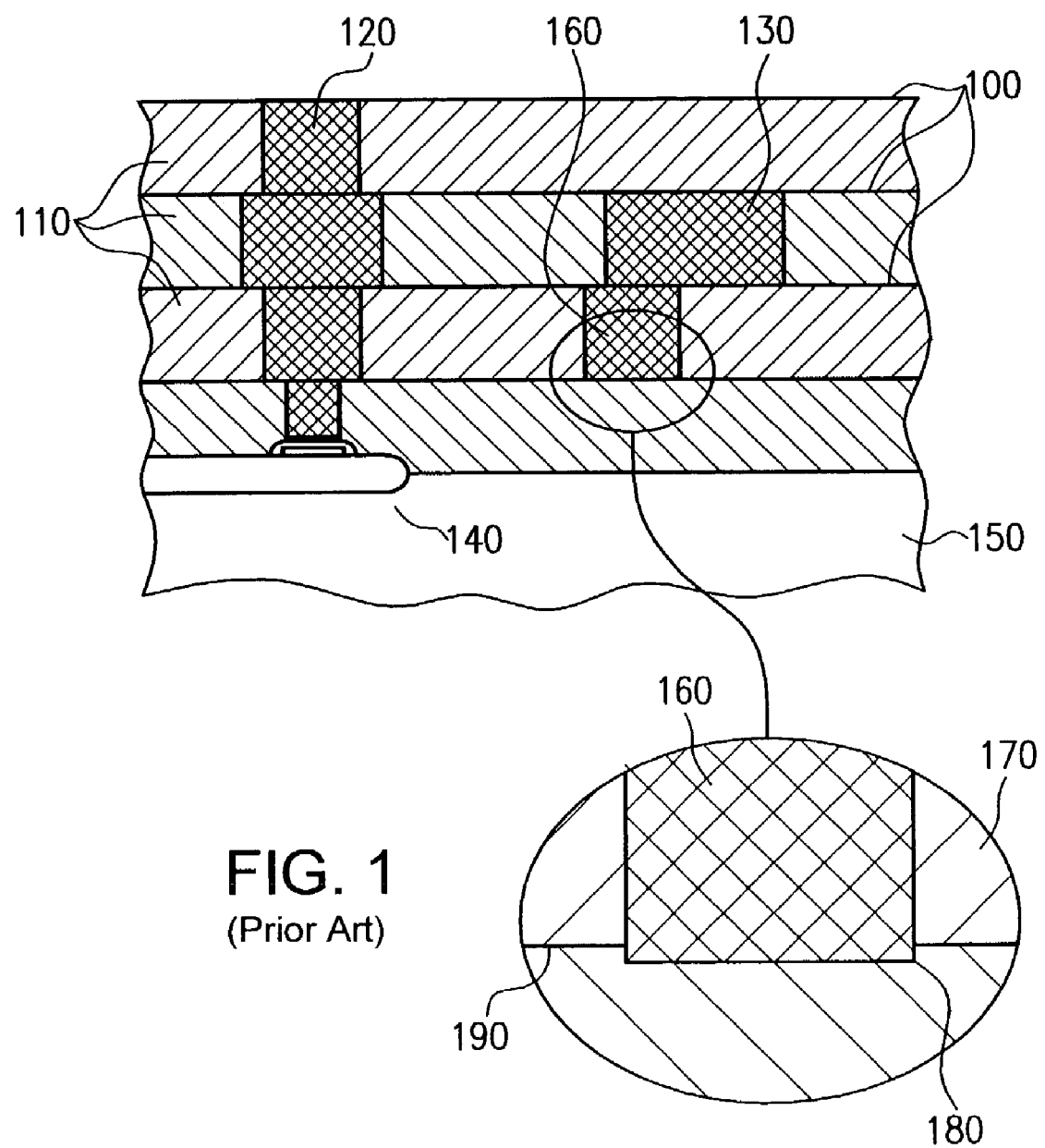
FIG. 1 shows a cross-sectional view of a conventional multi-layer structure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
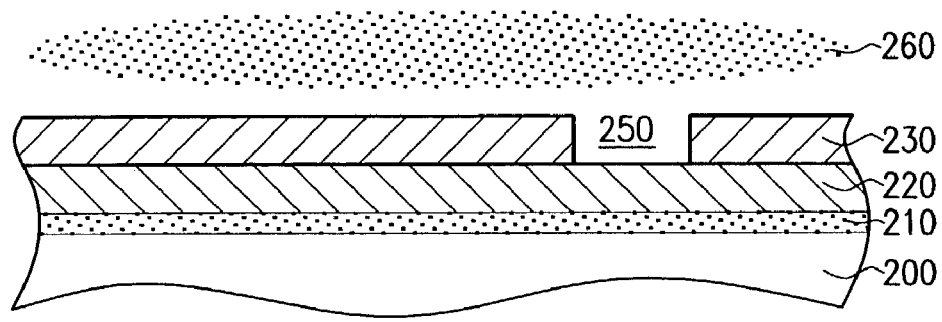
FIG. 2 shows several layer structures in a cross-sectional view, wherein each illustration shows a stage of a structure manufacturing process according to one illustrative embodiment.
Figure 2B:
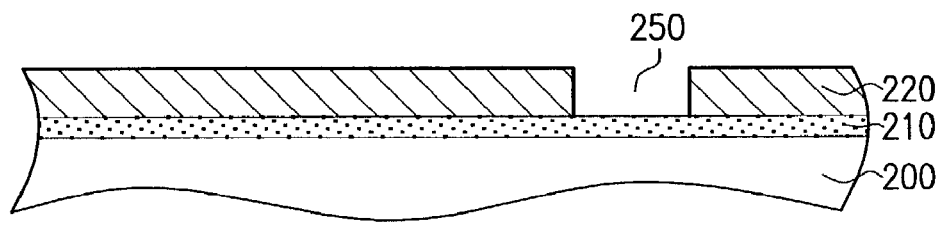
Figure 2C:
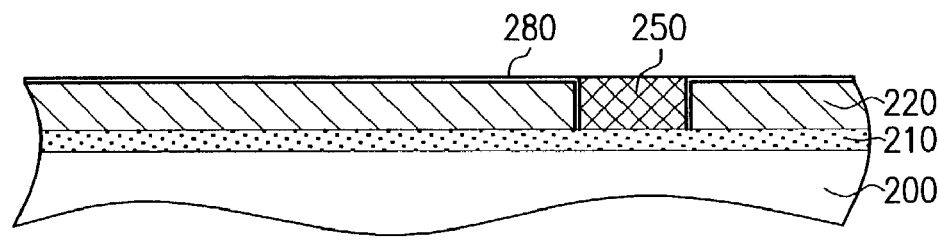

Referring now to the drawings, FIGS. 2a–2c illustrate several structure manufacturing steps to build up a semiconductor structure. FIG. 2a is a cross-sectional view of a wafer 200 that has different layers 210, 220, 230, wherein the wafer 200 is used as a base. Layer 210 is a signal layer that comprises a chemical element that causes a characteristic optical emission when the chemical element comes into contact with an etch plasma.

The signal layer 210 is an additional layer which has substantially no influence on electrical devices that are further embedded into the structure. The chemical element may be selected to have a characteristic optical emission that has no overlapping spectrum with a spectrum of an optical emission effected by another chemical element that is to be plasma etched. The chemical element may further be selected to effect no electrical degradation of an electrical conductance and to have no mobility through other layers of the wafer. The signal layer 210 may be comprised of, for example, strontium or strontium-doped silicon or other materials.

The layer 220 is located on top of the signal layer 210 and may be made of a dielectric material, such as silicon dioxide, silicon nitride or any other material having a high or low dielectric constant, as required for the specific application. The layer of dielectric material 220 is covered by a layer of photoresist material 230, either positive- or negative-type photoresist material. It can be seen that the layer of photoresist material 230 comprises a gap 250, that may have been generated by exposing the layer of photoresist material 230 to ultraviolet light through a layout mask. In the present embodiment, the patterned layer of photoresist 230, with the gap 250 formed therein, is used for plasma etching a via hole into the layer of dielectric material 220.

It is to be noted that the via hole example has been selected to describe the function of the signal layer 210 in a semiconductor structure manufacturing process. FIGS. 2a–2c illustrate how to embed the via hole into the layer structure by using the signal layer.

When plasma etching the above-described semiconductor structure, the dielectric material that is not covered by the photoresist is removed as long as the etch plasma 260 has no contact to the signal layer 210. If the etch plasma 260 has reached the signal layer 210, the chemical element of the signal layer 210 causes the characteristic optical emission that may be detected by a sensor that may be specifically adapted to detect optical plasma emissions.

A detected predefined characteristic optical plasma emission initiates a plasma etch endpoint process according to one illustrative embodiment of the present embodiment, i.e., the plasma etch endpoint process terminates the application of the etch plasma. After the plasma etch endpoint process has terminated the application of the etch plasma 260 to the surface of the wafer, the layer of photoresist material 230 is removed. FIG. 2b illustrates the result of the above-described procedure, wherein the etched gap 250 may be used to form a via hole. For generating the via hole, the gap 250 is filled with a conductive material that may be used to contact a metal line with a metal layer 280 (shown in FIG. 2c) that is applied to the structure.

Figure 3A:
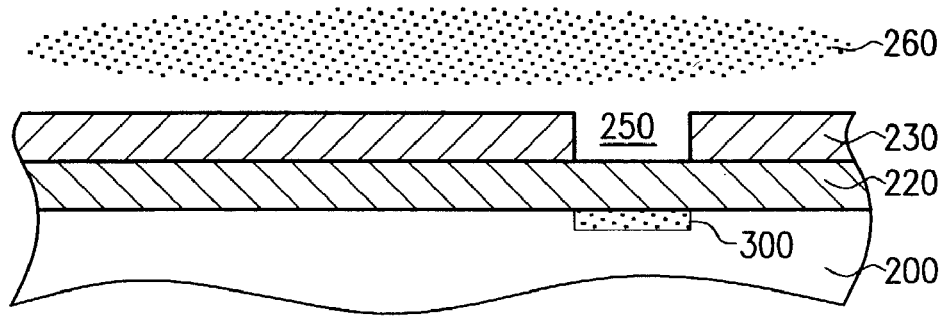
FIG. 3 shows further layer structures in a cross-sectional view, wherein each illustration shows a stage of a structure manufacturing process according to another illustrative embodiment.
Figure 3B:
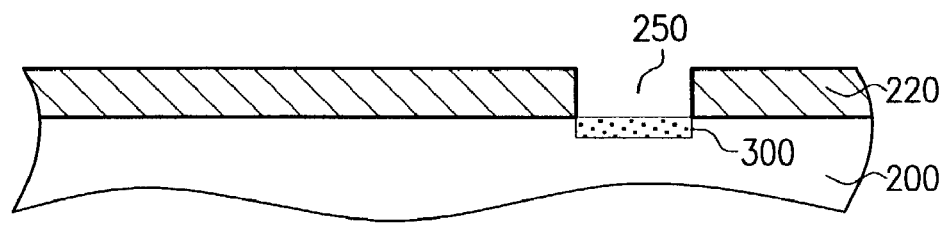
Figure 3C:
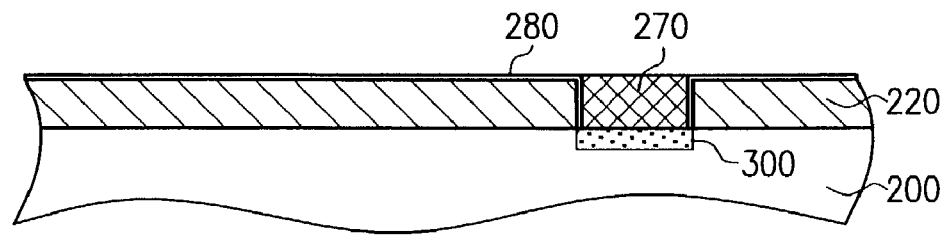

Turning now to FIGS. 3a–3c, and in particular to FIG. 3a, a further application of the above-mentioned signal layer 210 will be described in the following according to another illustrative embodiment. Again, an etch plasma 260 is applied to the semiconductor structure of FIG. 3a. The semiconductor structure of FIG. 3a is of substantially the same construction of layers compared to the semiconductor structures of FIGS. 2a–2c. However, the area of the signal layer 300 does not cover the whole wafer area, because the signal layer 300 is a patterned signal layer.

The patterned signal layer 300 may be formed by performing an ion implant process using the patterned layer of photoresist 230 as a mask. In one embodiment, both the signal layer 300 and the layer of dielectric material 220 may be patterned to be covered in wafer edge regions. In a subsequent process step, the actual patterning of the signal layer may then be performed to enable the signaling function even where the structures are extremely small in size.

The etch plasma 260 is applied to the surface of the semiconductor structure, and the etch plasma removes the dielectric material that is not covered by the photoresist 230. When the etch plasma 260 contacts the patterned signal layer 300, the chemical element causes a characteristic optical emission. The characteristic optical emission is detected by a sensor that is adapted to detect the spectrum of wavelength effected by the characteristic optical emission.

FIG. 3b shows the semiconductor structure after applying the etch plasma and after removing the photoresist material 230. The etched via hole 250 in the dielectric layer 220, illustrated in FIG. 3b, is then filled with a conductive material 270, for example, to contact a metal layer 280. The result of the described process is illustrated in FIG. 3c, and the process can be repeated sequentially to produce a multi-layer structure.

In the present embodiment, the etch plasma 260 illustrated in FIG. 3a is turned off when the etch plasma has reached the patterned signal layer 300. In another embodiment, the plasma etch process may be terminated, when the signal layer 210 or the patterned signal layer 300 may be completely removed by the etch plasma. In a further embodiment, the plasma etch process may be continued when the etch plasma contacts the signal layer or the patterned signal layer, and a reduced plasma etch rate is used afterwards.

It can be seen in FIG. 3b that the patterned signal layer 300 is located where the via hole 250 is to be placed according to the present embodiment. In another embodiment, the signal layer may be patterned to define an area where the electrical circuits and devices are highly integrated. This area of high integration may have a reduced etch rate compared to areas of lower integration. To avoid an early termination of the plasma etch process, the areas having a lower etch rate may be patterned so that they are completely provided with an underlying signal layer. A characteristic optical emission effected by the signal layer terminates then the etch plasma application when the etch plasma comes into contact with the chemical element of the signal layer.

It is to be noted that the mentioned signal layers may also be made of chemical compounds that effect the characteristic optical emissions.

Figure 4:
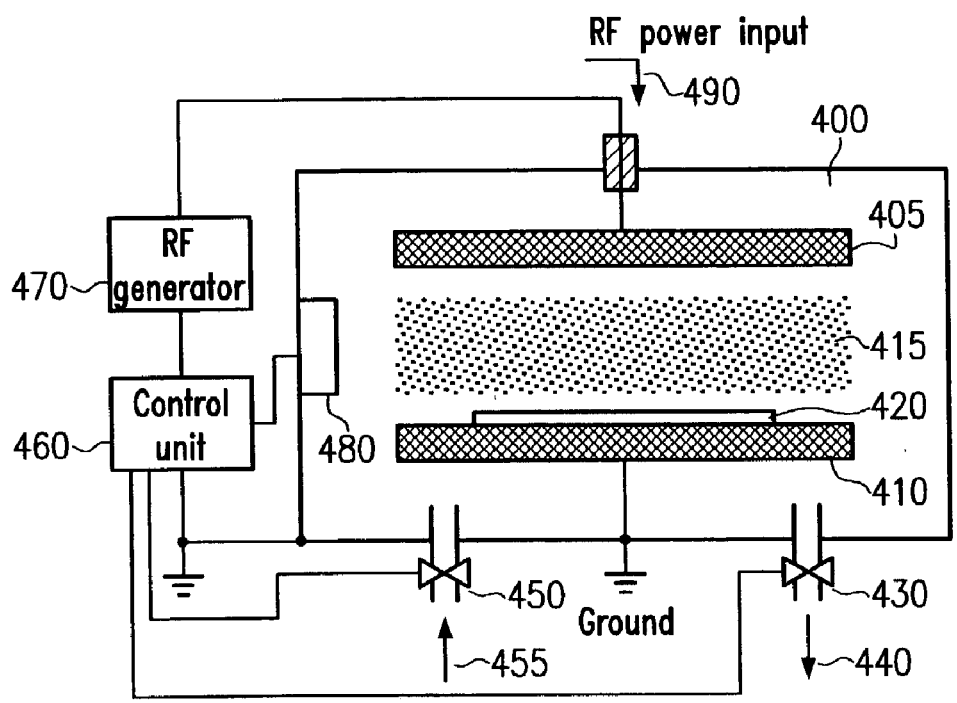
FIG. 4 shows a plasma etch apparatus according to a further illustrative embodiment.

Turning now to FIG. 4, a plasma etch apparatus is shown that may be adapted to detect the above-mentioned characteristic optical emission. The plasma etch apparatus substantially comprises two electrodes 405, 410 mounted in a plasma generation reactor 400, wherein one electrode 410 is connected to a ground and the other electrode 405 is connected to an RF (radio frequency) generator 470. The RF generator 470 is adapted to generate an RF power to apply an electrical field across the electrodes 405 and 410. The wafer 420 that is to be plasma etched is placed on the electrode 410.

The plasma etch apparatus further comprises a gas inlet valve 450 and a gas outlet valve 430 to provide a gas flow for establishing a gas concentration and pressure in the plasma generation reactor 400. These parameters are adjusted in coordination with the above-mentioned RF power to create an environment in the plasma generation reactor 400 to generate the etch plasma 415. The gas inlet and outlet valves 430, 450 and an optical sensor 480 are connected to a control unit 460. The optical sensor 480 is adapted to detect the above-mentioned characteristic optical plasma emissions.

The control unit 460 is further connected to the RF generator 470 to control the Re power applied to the plasma generation reactor 400. The wafer 420 is placed on the electrode 410 because ions that are in the plasma field 415 are accelerated towards the electrode 410, and therefore towards the wafer 420. The accelerated ions strike the wafer surface with a high momentum, resulting in a mass transport from the wafer surface. The mass transport effects an optical emission of light, wherein the chemical element or chemical compound of the signal layer causes the characteristic optical emission in a predefined wavelength spectrum when the etch plasma comes into contact with the signal layer. The optical sensor 480 is adapted to detect these wavelengths and the control unit 460 terminates the plasma etch process, for instance, by controlling the RF generator 470 to reduce the application of the RF power, or by changing the gas environment in the reactor 400 by controlling one or both valves 430, 450.

Figure 5:
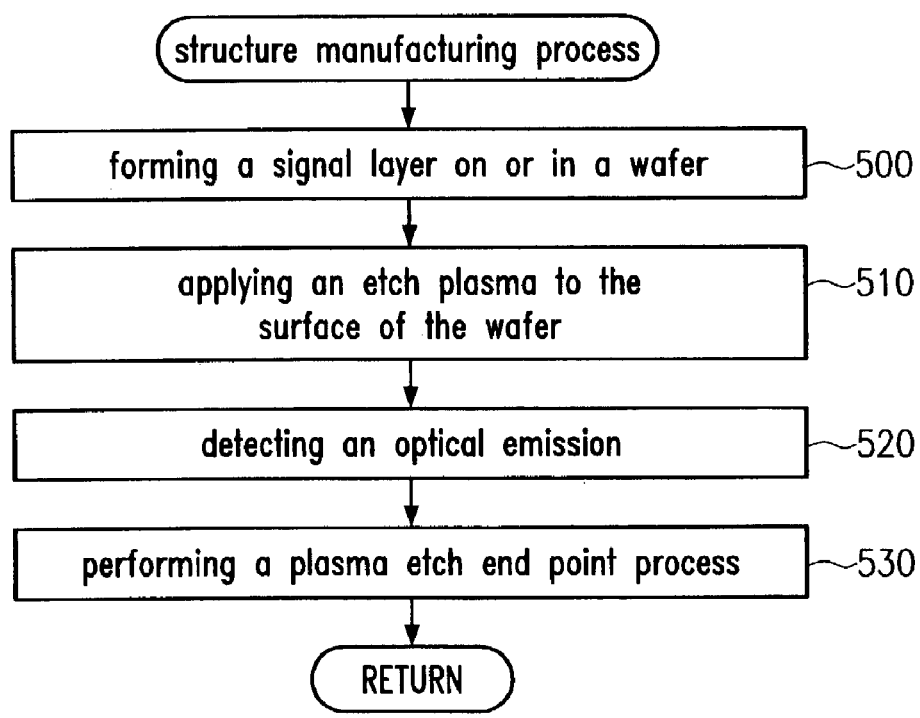
FIG. 5 is a flowchart illustrating a structure manufacturing process according to another illustrative embodiment.

Turning now to FIG. 5, the flowchart illustrates a structure manufacturing process according to one illustrative embodiment of the present invention. As described therein, the illustrative structure manufacturing process comprises in step 500 the formation of a signal layer on or in a wafer. It is to be noted that, in a further embodiment, the step 500 of the structure manufacturing process may comprise an ion implementation process, wherein the chemical element of the signal layer is implanted into the structure. In one embodiment, the generated signal layer expands over the whole wafer surface, wherein signal layers generated according to another embodiment are patterned as described above.

The second step of the structure manufacturing process is step 510, wherein an etch plasma 260, 415 is applied to the surface of the wafer 200, 420. The etch plasma effects a mass transport from the wafer surface. If the etch plasma reaches the signal layer, the chemical element of the signal layer causes a characteristic optical emission in a predefined spectrum. The optical sensor 480 of the plasma etch apparatus detects the optical emission according to step 520 of the structure manufacturing process. The control unit 460 of the plasma etch apparatus then initiates a plasma etch endpoint process in step 530.

In the present embodiment, the plasma etch endpoint process terminates the application of the etch plasma to the surface of the wafer. In a further embodiment, the plasma etch endpoint process adjusts the current etch rate to a reduced etch rate. The etch rate describes an etch removal per etch process time.

Many parameters can be manipulated during the plasma etch endpoint process. Substantially, those parameters may be the gas flow, the gas concentration, the pressure and the RF power. According to another embodiment, step 530 of the structure manufacturing process comprises an adjustment of one or more of the above-mentioned parameters.

In yet another embodiment, step 500 of the structure manufacturing process comprises the formation of a stop layer in a wafer. The stop layer predominantly provides an etch plasma resistance that effects a low plasma etch rate. Steps 510 to 530 of the structure manufacturing process according to the present embodiment are similar to those of the above-described embodiments but differ in that the chemical element of the stop layer causes a characteristic optical emission when coming into contact with an etch plasma. Thus, the stop layer of this embodiment acts as a signal layer of the embodiments described above.

Assuming, a semiconductor structure comprises a conventional stop layer, step 500 of the structure manufacturing process may then comprise implanting the chemical element, so that the conventional stop layer can now be used as a signal layer.

As is apparent from the foregoing description, all of the embodiments as described may advantageously provide an improved plasma etch accuracy because of an improved precision of the optical endpoint detection.

The above-described technique provides the advantage that, even for very small exposed areas, the optical endpoint detection does not result in a disturbed endpoint signal. In addition, the fact that the above-described technique increases the signal-to-noise ratio simplifies the manufacturing. This is because the arrangements are able to compensate for incoming layer thickness variations and changes in the effective etch rate of the process. Thus, when several etch processes are used to pattern layers where the ratio of etch-exposed areas to total substrate areas is very low, the endpoint signal is not disturbed by the etch of large areas with other etch characteristics. Furthermore, the arrangement may have the additional advantage to provide a reduction of the impact of other large areas etching with a different etch rate on the endpoint detection performance. Often these areas, e.g., wafer edge exclusion zones, are etched with a higher etch rate than in the rest of the wafer surface. By applying a patterned signal layer, it is avoided that a plasma etch process is terminated, when the etch front hits the interface earlier than the rest of the wafer.

By applying the signal layer principle and providing a patterned signal layer in the later disturbing areas, e.g., covering the wafer edge exclusion zones during the deposition process and performing a separate removal in the wafer edge exclusion zone, this can prevent the influence of the undesired wafer areas on the endpoint detection.

The chemical elements or compounds may be selected based on the knowledge of the emission lines/bands of the elements and the emission properties of the process chemistry in that spectral range to avoid overlapping spectral ranges. Further, the selection of the species may be based on the compatibility of the signal layer material in terms of electrical and technological properties for the application in the device. It has been shown that a suitable chemical element for use in the embodiments is strontium. It is, however, to be noted that other elements may be used instead.

By applying the signal layer to a wafer, the signal-to-noise ratio for endpoint detection can be dramatically improved. So, this method can allow for optical endpoint detection in etch applications where this could not be used before because of the low exposed area ratio. Further, the embodiments can improve the robustness of the endpoint detection for given processes.

It is further to be noted that using the signal layer advantageously allows for precisely reaching a desired etch depth with uniform materials in the functional layers by means of the endpoint detection.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of manufacturing a semiconductor structure including at least one electrical device, the method comprising:
forming a patterned signal layer on or in a wafer, wherein said signal layer comprises strontium that causes a characteristic optical emission when coming into contact with an etch plasma, said chemical element having no primary influence on the electrical properties of said at least one electrical device;
applying an etch plasma to the surface of the wafer; and
performing a plasma etch endpoint process when said characteristic optical emission is detected.

2. The method of claim 1, wherein said signal layer is an etch stop layer, and said plasma etch endpoint process terminates the etch plasma to the surface of the wafer when said etch plasma comes into contact with said etch stop layer.

3. The method of claim 1, wherein said chemical element is selected to effect a characteristic optical emission having a characteristic optical spectrum not overlapping with a spectrum of an optical plasma emission effected by another chemical element present in said wafer.

4. The method of claim 1, wherein said chemical element is selected to effect no electrical degradation of an electrical conductance in said wafer.

5. The method of claim 1, wherein said chemical element is selected to have no mobility through other layers of said wafer.

6. The method of claim 1, wherein said at least one electrical device comprises an electrical integrated circuit.

7. The method of claim 1, wherein said characteristic optical emission is an optical emission having a characteristic spectrum.

8. The method of claim 7, wherein said characteristic spectrum substantially consists of one wavelength.

9. The method of claim 1, wherein said semiconductor structure is a multi-layer structure.

10. The method of claim 1, wherein forming said patterned signal layer comprises performing an ion implantation process to form said signal layer.

11. The method of claim 1, wherein said etch plasma is applied to the surface of said wafer to plasma etch at a defined etch rate, wherein said plasma etch endpoint process comprises reducing said etch rate.

12. The method of claim 1, wherein said etch plasma is applied to the surface of said wafer by adjusting plasma etch parameters, wherein said plasma etch endpoint process comprises adjusting at least one of said plasma etch parameters.

13. The method of claim 1, wherein the plasma etch rate of said signal layer is substantially the same as the plasma etch rate of the material adjacent to said signal layer.

14. A method of manufacturing a semiconductor structure, the method comprising:
forming a stop layer providing an etch plasma resistance effecting a low plasma etch rate, said stop layer comprising strontium, wherein said strontium causes a characteristic optical emission when coming into contact with an etch plasma, wherein forming said stop layer comprises performing an ion implantation process to form said stop layer;
applying an etch plasma to the surface of a wafer; and
performing a plasma etch endpoint process when said characteristic optical emission is detected.

15. The method of claim 14, wherein ions are implanted in a predefined area of said wafer to pattern said stop layer.

16. The method of claim 14, wherein said plasma etch endpoint process terminates the etch plasma when the etch plasma comes into contact with said strontium.

17. A method of manufacturing a semiconductor structure, the method comprising:
forming a signal layer on or in a wafer, wherein said signal layer is a patterned signal layer and wherein said patterned signal layer is located in a predefined area of said wafer that is selected to be an area having a reduced plasma etch rate;
applying an etch plasma to the surface of said wafer; and
performing a plasma etch endpoint process when a characteristic optical emission is detected,
wherein said characteristic optical emission is caused by a chemical element of said patterned signal layer when said chemical element comes into contact with said etch plasma.

18. A method of manufacturing a semiconductor structure including at least one electrical device, the method comprising:
forming a signal layer on or in a wafer, wherein said signal layer comprises strontium that causes a characteristic optical emission when coming into contact with an etch plasma, said strontium having no primary influence on the electrical properties of said at least one electrical device, wherein a plasma etch rate of said signal layer is substantially the same as a plasma etch rate of a material adjacent to said signal layer;
applying an etch plasma to the surface of the wafer; and
performing a plasma etch endpoint process when said characteristic optical emission is detected.

19. A method of manufacturing a semiconductor structure including at least one electrical device, the method comprising:
forming a signal layer on or in a wafer, wherein said signal layer comprises a chemical element that causes a characteristic optical emission when coming into contact with an etch plasma, said chemical element having no primary influence on the electrical properties of said at least one electrical device;
applying an etch plasma to the surface of the wafer; and
performing a plasma etch endpoint process when said characteristic optical emission is detected, wherein the plasma etch rate of said signal layer is substantially the same as the plasma etch rate of the material adjacent to said signal layer.

20. The method of claim 19, wherein said chemical element is strontium.

21. A method of manufacturing a semiconductor structure, the method comprising:
performing an ion implantation process to form a stop layer providing an etch plasma resistance effecting a low plasma etch rate, said stop layer comprising a chemical signal element, wherein said chemical signal element causes a characteristic optical emission when coming into contact with an etch plasma;
applying an etch plasma to the surface of a wafer; and
performing a plasma etch endpoint process when said characteristic optical emission is detected.

22. The method of claim 21, wherein ions are implanted in a predefined area of said wafer to pattern said stop layer.

23. A method of manufacturing a semiconductor structure including at least one electrical device, the method comprising:
forming a patterned signal layer on or in a wafer, wherein said signal layer comprises a chemical element that causes a characteristic optical emission when coming into contact with an etch plasma, said chemical element having no primary influence on the electrical properties of said at least one electrical device, and wherein forming said patterned signal layer comprises performing an ion implantation process to form said signal layer;

applying an etch plasma to the surface of the wafer; and performing a plasma etch endpoint process when said characteristic optical emission is detected.

24. The method of claim 23, wherein the plasma etch rate of said signal layer is substantially the same as the plasma etch rate of the material adjacent to said signal layer.

25. A method of manufacturing a semiconductor structure including at least one electrical device, the method comprising:

forming a patterned signal layer on or in a wafer, wherein said signal layer comprises a chemical element that causes a characteristic optical emission when coming into contact with an etch plasma, said chemical element having no primary influence on the electrical properties of said at least one electrical device;

applying an etch plasma to the surface of the wafer, wherein the plasma etch rate of said signal layer is substantially the same as the plasma etch rate of the material adjacent to said signal layer; and performing a plasma etch endpoint process when said characteristic optical emission is detected.

* * * * *